United States Patent [19] … [11] Patent Number: 4,854,263
Chang et al. … [45] Date of Patent: Aug. 8, 1989

[54] INLET MANIFOLD AND METHODS FOR INCREASING GAS DISSOCIATION AND FOR PECVD OF DIELECTRIC FILMS

[75] Inventors: Mei Chang; David N. K. Wang, both of Cupertino; John M. White, Hayward; Dan Maydan, Los Altos Hills, all of Calif.

[73] Assignee: Applied Materials, Inc., Santa Clara, Calif.

[21] Appl. No.: 85,424

[22] Filed: Aug. 14, 1987

[51] Int. Cl.$^4$ ............................................. C23C 16/00
[52] U.S. Cl. .................... 118/715; 118/50.1; 118/725; 118/728
[58] Field of Search ........................ 118/725, 728, 50.1, 118/715

[56] References Cited

U.S. PATENT DOCUMENTS 4,354,909 10/1982 Takagi et al. ...................... 427/39 X
4,637,853 1/1987 Bumble et al. ..................... 156/345
4,668,365 5/1987 Foster et al. ................... 204/192.23

OTHER PUBLICATIONS

Fujita et al, "Silicon Nitride Films by Plasma-CVD from SiH$_4$-N$_2$ and SiF$_4$-N$_2$-H$_2$ Gas Mixtures", 1984 IEDM, pp. 630-633.
Dun et al, "Mechanisms of Plasma-Enhanced Silicon Nitride Deposition Using SiH$_4$/N$_2$ Mixture", J. Electrochem. Soc: Solid-State Science and Technology, Jul. 1981, vol. 128, No. 7, pp. 1555-1563.
Claassen, "Ion Bombardment-Induced Mechanical Stress in Plasma-Enhanced Deposited Silicon Nitride and Silicon Oxynitride Films", Plasma Chemistry & Plasma Processing, vol. 7, No. 1, 1987, pp. 109-124.

Primary Examiner—Bernard Pianalto
Attorney, Agent, or Firm—Flehr, Hohbach, Test, Albritton & Herbert

[57] ABSTRACT

An inlet gas manifold for a vacuum deposition chamber incorporates inlet apertures which increase in diameter or cross-section transverse to the direction of gas flow. The aperture configuration increases the dissociation gases such as nitrogen and, thus increases the rate of silicon nitride deposition provided by nitrogen gas chemistry, without requiring the use of reactants such as ammonia. While one could use ammonia in the deposition gas chemistry if desired, the process provides the option of completely eliminating ammonia. The inlet manifold containing the increasing-diameter gas inlet holes provides enhanced control of the process and the deposited film, and is also useful for forming other dielectrics such as silicon oxide and silicon oxynitride. In particular, silicon oxynitride films are characterized by low hydrogen content and by compositional uniformity.

11 Claims, 2 Drawing Sheets

INLET MANIFOLD AND METHODS FOR INCREASING GAS DISSOCIATION AND FOR PECVD OF DIELECTRIC FILMS

BACKGROUND OF THE INVENTION

The present invention relates to plasma-enhanced chemical vapor deposition (PECVD) of materials such as silicon nitride, silicon oxide and silicon oxynitride; to the use of parallel plate PECVD reactors for depositing these materials; and, in particular, to a gas inlet manifold for a parallel plate reactor and a method of using the manifold and the reactor for depositing these materials at a high rate and for depositing silicon nitride and silicon oxynitride without using high-hydrogen content gases such as ammonia.

A. Problems Associated with Ammonia-Based Chemistry

To achieve even low to moderate deposition rates (less than 1000 Angstroms/min.), plasma-enhanced processes conventionally must use ammonia to deposit silicon nitride or silicon oxynitride. A typical PECVD gas flow chemistry for depositing silicon nitride comprises silane and ammonia reactants along with a diluent, e.g., nitrogen, argon or helium as follows:

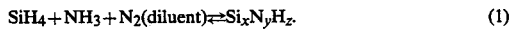

$$SiH_4 + NH_3 + N_2(\text{diluent}) \rightleftharpoons Si_xN_yH_z. \quad (1)$$

Undesirably, as a consequence of using ammonia to obtain acceptable deposition rates and throughput, the concentration of hydrogen in the deposited silicon nitride can be quite high, as much as 25–30 atom percent. The presence of hydrogen in structures formed relatively early in the IC fabrication process and the hydrogen diffusion which results during subsequent high temperature fabrication steps can cause non-uniform electrical characteristics. Even for final passivation films, however, the presence of such high concentrations of hydrogen can create problems. One such problem is decreased MOS device lifetime, which worsens as the minimum feature size decreases.

B. Limitations of Previous Nitrogen-Based Gas Chemistry Processes Used in Parallel Plate Reactors To our knowledge, nitrogen-based gas chemistry has not widely been used in parallel plate plasma reactor, PECVD processes to form low hydrogen content silicon nitride. The nitrogen-based gas chemistry uses the reactants SiH$_4$ and nitrogen at low frequency RF power (for example, 50 kHz) to provide compressively stressed, relatively dense films, but deposition rates of only about 200–400 Angstroms per minute or less. As was alluded to previously, this low deposition rate capability (and the resulting low throughput) is the crucial limitation of this prior art nitride-based gas chemistry process, and is the reason for its limited use. To increase the deposition rate, power must be increased, which causes potentially very high compressive stress, possibly leading to wrinkling, and other structural degradation.

C. Magnetron-Assisted PECVD Using Nitrogen Gas Chemistry

To our knowledge, the only prior use of nitrogen-based gas chemistry without ammonia to deposit good quality, compressively stressed silicon nitride films at relatively high deposition rates is described in commonly assigned U.S. Pat. No. 4,668,365, entitled "APPARATUS AND METHOD FOR MAGNETRON-ENHANCED PLASMA-ASSISTED CHEMICAL VAPOR DEPOSITION", issued May 26, 1987 (referred to here as the "referenced magnetic field-enhanced PECVD reactor/patent"), which patent is incorporated by reference herein in its entirety. The referenced magnetic field-assisted PECVD patent describes a cylindrical reactor in which the substrate(s) is oriented parallel to the cylinder axis; RF power typically of 400 to 1,000 watts is applied to form DC bias of 50 to 250 volts perpendicular to the substrate; a pair of circular electromagnets form a magnetic field typically of 25 to 100 gauss parallel to the substrate; and SiH$_4$ and N$_2$ gaseous reactants are communicated into the chamber at typical total flows of 100–800 sccm using a substrate temperature of 20°–200° C. and a chamber pressure of less than 100 millitorr to deposit slightly compressively stressed silicon nitride at a deposition rate of 1,000 to 5,000 Angstroms per minute. The deposited silicon nitride film is compressively stressed, and has a hydrogen content of 5–13 weight percent and a refractive index N$_f$ of about 1.7–2.

SUMMARY OF THE INVENTION

A. Objects

In view of the above discussion, it is a primary object of the present invention to provide a gas manifold which is designed to increase the dissociation and reactivity of gases such as nitrogen.

It is another related object of the present invention to provide an improved parallel plate electrode and gas inlet manifold configuration for forming low hydrogen content silicon nitride films at high deposition rates using nitrogen with reduced ammonia or without ammonia.

It is another related object of the present invention to provide an improved parallel plate electrode and gas inlet manifold configuration for forming silicon oxide films and for forming low hydrogen content silicon oxynitride films at high deposition rate using nitrogen with reduced ammonia or without ammonia.

B. Summary

These and other objects are achieved in our present invention, which comprises a parallel plate RF vacuum chamber system having a gas inlet manifold plate for communicating gas such as nitrogen into the chamber, the plate having a plurality of apertures, and each aperture comprising an outlet at the chamber or processing side of the plate and an inlet spaced from the processing side, with the outlet being larger than the inlet for enhancing the dissociation and reactivity of the gas.

The aperture can be configured in any of a number of preferably concave cross-sectional configurations including parabolic or hyperbolic cross-sections or the presently preferred conical cross-section.

In still another aspect, the gas inlet apertures are densely patterned as an array of overlapping/interlocking face-centered hexagons. An individual aperture defines an edge of one associated hexagon and is also at the center of a second associated hexagon. This dense configuration promotes uniform high rate deposition without patterns, streaks or other non-uniformities.

In another aspect, the present invention relates to a process for forming highly reactive gas such as nitrogen comprising flowing the gas from a region of relatively high pressure through a nozzle passageway to a region of relatively low pressure, the passageway including an inlet end and an outlet end which is larger than the inlet end.

In another aspect, the present invention relates to an improved process for depositing silicon nitride on a substrate in a parallel plate RF vacuum chamber, comprising providing a gas inlet manifold plate closely adjacent the substrate having apertures formed therein, each having a gas inlet end and a gas outlet end larger than the inlet end opening into said chamber; and simultaneously applying RF energy to the chamber at the face plate while communicating a reactant gas flow comprising $SiH_4$ and $N_2$ into the aperture inlet to form a plasma at the chamber side of the face plate for depositing silicon nitride. The process is characterized by the inherent capability to form low nitrogen content, low compressively stressed silicon nitride films at high deposition rates, presently within the range of about 2000–6000 Angstroms per minute.

The present invention also relates to an improved process for depositing silicon oxynitride on a substrate in a parallel plate RF vacuum chamber, comprising providing a gas inlet manifold plate closely adjacent the substrate having apertures formed therein, each having a gas inlet end and a gas outlet end larger than the inlet end opening into said chamber; and simultaneously applying RF energy to the chamber at the face plate while communicating a reactant gas flow comprising $SiH_4$, $N_2O$ and $N_2$ to the aperture inlet to form a plasma at the chamber side of the face plate for depositing silicon oxynitride. The process is characterized by the inherent capability to form low nitrogen content, low compressively stressed silicon oxynitride films at high deposition rates, presently within the range of about 3,000–7,000 Angstroms per minute.

In still another aspect, the present invention relates to an improved process for depositing silicon oxide on a substrate in a parallel plate RF vacuum chamber, comprising providing a gas inlet manifold plate closely adjacent the substrate having apertures formed therein, each having a gas inlet end and a gas outlet end larger than the inlet end opening into said chamber; and simultaneously applying RF energy to the chamber at the face plate while communicating a reactant gas flow comprising $SiH_4$ and $N_2O$ into the aperture inlet to form a plasma at the chamber side of the face plate for depositing silicon oxide at high deposition rates, presently within the range of about 6,000–11,000 Angstroms per minute.

BRIEF DESCRIPTION OF THE DRAWINGS

The above and other aspects of the present invention are disclosed with respect to the drawings in which.

DETAILED DESCRIPTION OF THE INVENTION

A. Apparatus

1. Exemplary PECVD Reactor 10

Figure 1:
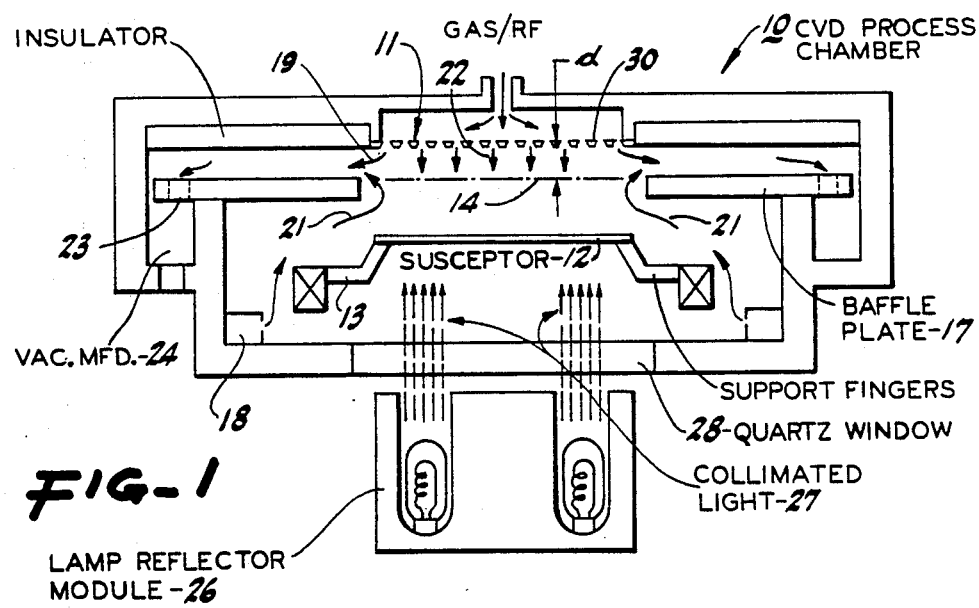
FIG. 1 schematically depicts a parallel plate CVD plasma reactor which benefits from incorporation of the gas inlet manifold according to the present invention.

FIG. 1 schematically depicts a parallel plate CVD (chemical vapor deposition) reactor 10 which benefits from using a gas inlet manifold 11 made according to the present invention. The reactor 10 is described in co-pending U.S. patent application Ser. No. 944,492, entitled "THERMAL CVD/PECVD CHEMICAL REACTOR AND USE FOR THERMAL CHEMICAL VAPOR DEPOSITION ON SILICON DIOXIDE AND IN-SITU MULTI-STEP PLANARIZED PROCESS", filed Dec. 19, 1986, in the name of Wang, et al., which patent application is hereby incorporated by reference in its entirety. Reactor 10 contains a highly thermally responsive susceptor 12 which preferably is mounted on a vertically movable cantilevered beam or support fingers 13 so that the susceptor 12 (and the wafer supported on the upper surface of the susceptor) can be controllably moved between a lower loading/off-loading position and an upper processing position 14 which is closely adjacent the inlet manifold 11.

When the susceptor 12 and the wafer are in the processing position 14, they are surrounded by a baffle plate 17 having a plurality of circularly spaced holes 23 which exhaust into annular vacuum manifold 24. The upper, inlet manifold 11 has outer rings of holes therein which provide a purge gas flow indicated generally by arrows 19. A second, lower purge manifold 18 provides an upwardly directed purge flow 21. The upper and lower purge gas flows 19 and 21 are separate from the inlet flow 22 of process gas, which enters chamber 10 via a circular array of inlet holes located within the outer ring of purge gas holes.

As a result of the high pressure capability of the reactor 10, the baffle plate 17, and the dual purge flow, etc., during processing, gas inlet to the manifold along paths 22 is distributed radially uniformly along the susceptor and wafer, then is exhausted via the ports 23 into the circular vacuum manifold 24 by the vacuum pump system. A controlled plasma is formed adjacent the wafer by RF energy applied to the inlet manifold 11, which is also an RF electrode. A circular external lamp module 26 provides a collimated annular pattern 27 of light via quartz window 28 onto an annular outer peripheral portion of the susceptor 12, thereby compensating for the natural heat loss pattern of the susceptor and providing rapid nd uniform susceptor and wafer heating for effecting deposition.

The variable close spacing, d, between the manifold face plate 30 and the wafer 14 supported on susceptor 12, as well as the various other features described in detail in the aforementioned referenced patent application, including the high pressure capability, the wide pressure regime, the uniform radial gas flow and the dual radial purge flow, all combine to provide a wide range of processing capability to reactor 10. This processing versatility includes oxide film deposition using plasma-enhanced TEOS gas chemistry and/or ozone-TEOS gas chemistry; high rate isotropic etching; film planarization; and reactor self-cleaning.

2. Gas Inlet Manifold Face Plate 30

The process capability of the referenced parallel plate reactor 10 has been increased, and the process capability of other CVD reactors in general and other parallel plate reactors in particular will be increased, by the use of the gas inlet manifold 11 and the face plate 30 which are depicted schematically in FIG. 1. The face plate 30 incorporates a large number of closely packed, specially configured holes or apertures 31, one of which is shown schematically in FIG. 2.

Figure 2:
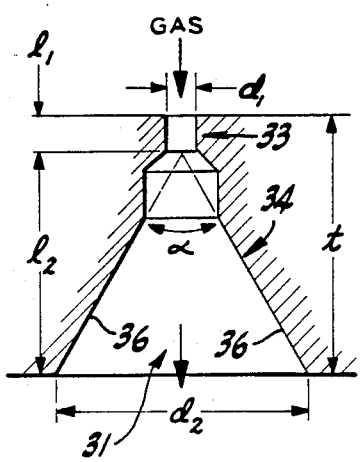
FIG. 2 is an enlarged vertical cross-section of the manifold illustrating one of the conical gas inlet apertures.

Referring further to FIG. 2, in one specific aspect, the present invention is directed to a gas inlet means having an aperture 31 which has an inlet of relatively small cross-section dimension $d_1$ on the gas inlet/relatively high pressure side of the inlet means and an outlet of relatively larger dimension $d_2$ on the gas outlet/vacuum chamber side of the inlet means. This increasing hole diameter in the direction of gas flow increases the dissociation and associated reactivity of gases such as nitrogen and, thus, increases deposition rates.

In the specific case of nitrogen, the use of the increasing-diameter holes 31 and the face plate 30 incorporating the holes 31 provide sufficient nitrogen dissociation and sufficiently high silicon nitride deposition rates that the ammonia-based gas chemistry of equation (1) is not required. Instead, we have been able to use gas chemistry of the type

$$SiH_4 + N_2 \rightleftharpoons Si_3N_4 + H_2. \quad (2)$$

This nitrogen-based gas chemistry leads to a combination of high deposition rate, low film hydrogen content and low controllable stress which was previously unattainable.

In another specific aspect, the present invention is directed to a parallel plate type of gas inlet manifold 11, FIG. 1, and to other gas inlet manifolds which incorporate increasing diameter holes 31 for introducing nitrogen or other reactive gas into an associated vacuum chamber to increase the dissociation and reactivity of the gas and thereby increase the rate at which an associated compound such as silicon nitride is deposited on a base or substrate such as a semiconductor wafer.

Figure 3:
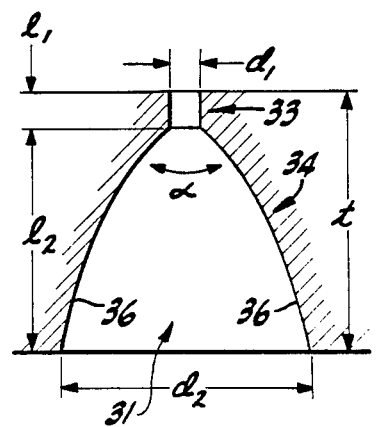
FIG. 3 depicts an alternative concave aperture.

The presently preferred configuration of the hole 31 is the conical cross-section shown in FIG. 2. However, other configurations including concave cross-sections, (FIG. 3), such as parabolic and convex cross-sections, can be used as well. Referring further to FIG. 2, the preferred configuration incorporates an inlet section 33 of length, $l_1$, and of constant diameter $d_1$, which provides even distribution of source gases and prevents plasma penetration into the gas manifold. A conical outlet section 34 of length, $l_2$, has a diameter which increases along the direction of gas flow to the outer value, $d_2$, for enhancing dissociation of the selected gas.

The face plate is aluminum and typically has a thin anodized aluminum oxide surface coating typically about 2 mils thick or less for enhancing electromultiplication. We have also used a Tufram ™ coating, which is a combination of Teflon ™ and anodization.

3. Effects of Increasing-Diameter Hole 31

First, the dissociation effect of the increasing diameter holes 31 is discussed above.

Second, we have discovered that the use of a dense array of small holes, i.e., a high number density of holes, provides a dense deposited film. The dense hole array also allows a smaller spacing, d (FIG. 1), between the face plate 30 and the substrate, without forming the hole pattern in the deposited film. The close spacing, d, results in more efficient use of the reactant gases and requires less silane for a given deposition rate.

However, in increasing the hole density, the hole opening, $d_1$, must not be so small as to detract unduly from the dissociation enhancement effect. For a given plate thickness, t (FIG. 2), the angle $\alpha$ subtended by the sides 36 of the hole 31 is a convenient measure of the relative hole diameter, $d_2$, and the potential for achieving a high density hole array. As examples, using the preferred hexagonal close pack hole pattern described below and a plate thickness of 400 mils (0.4 inches), (1) $\alpha = 30°$ provides 770 holes in a six inch diameter face plate 30 and allows relatively close spacing $d = 300$ mils without patterning; and (2) $\alpha = 15°$ provides 1500 holes in the six inch diameter plate 30 and permits smaller electrode spacing $d = (150-200)$ mils without patterning.

Figure 4:
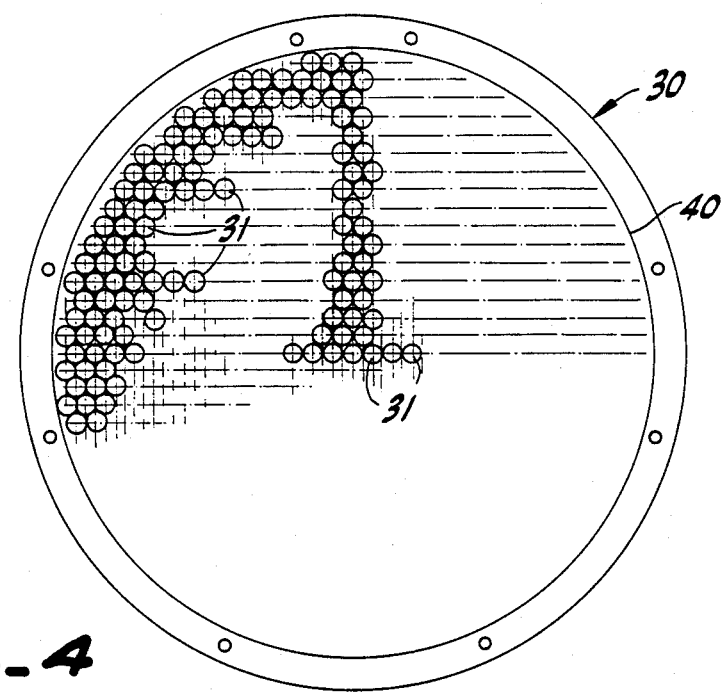
FIG. 4 is a plan view of a gas inlet manifold which incorporates a hexagonal close-pack array of gas inlet apertures.

Third, as alluded to above, we have found that maximum uniform deposition occurs using a hexagonal close-packed pattern or array of apertures 31. To illustrate, and referring to FIGS. 4 and 5, there are shown an exemplary hexagonal close pack gas manifold plate 30 for a six inch diameter wafer. The associated hole array has a radius of 2.975 inches. Each hole 31 has the following dimensions: $t = 400$ mils; $l_1 = 50$ mils; $l_2 = 350$ mils; $\alpha = 30°$; $d_1 = 16$ mils; and $d_2 = 190$ mils.

Figure 5:
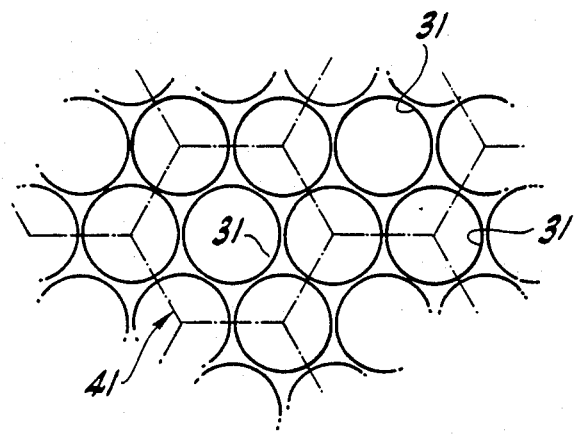
FIG. 5 is an enlargement of a portion of the manifold of FIG. 4.

The holes 31 are arranged in a pattern of overlapping interlocking face centered hexagons 41, FIG. 5. Each element 41 of the pattern comprises an array of six adjacent holes 31, the centers of which define the intersection points of the hexagon sides. Each individual face centered aperture 31 is the intersection point of seven hexagons including the surrounding hexagon and six additional peripheral hexagons. This interlocking face centered hexagon structure is believed to be the most highly dense aperture array available. That is, this array provides the highest number density of holes for a given manifold area.

B. Processes

1. Silicon Nitride, $N_f \approx 1.9$ and 2.0

In the industry, a refractive index, $N_f \approx 2.0$, is generally assumed to be indicative of high density and good quality for silicon nitride films deposited using conventional high temperature of CVD. As mentioned, the maximum silicon nitride deposition rates provided by the ammonia-based gas chemistry of equation (1) is about 1,000 Angstroms per minute. The resulting silicon nitride films typically are characterized by a hydrogen content of 20-30 atomic weight percent.

To provide a basis for comparing our nitrogen-based silicon nitride deposition process with the standard process, we used our process to deposit silicon nitride films having a refractive index $N_f \approx 2.0$ in the above-identified reactor 10 which incorporates the face plate 30. The process parameters used were 350 watts RF power; 4.5 torr pressure; wafer temperature of 300°-360° C. provided with the aid of the lamp module 26; electrode spacing, $d = 300$ mils; and $SiH_4/N_2$ gas chemistry flow rates of 110 sccm/4.5 slm (sccm means standard cubic centimeter per minute, while slm refers to standard liters per minute).

As summarized by the data in Table 1 for silicon nitride films deposited on a six inch diameter silicon wafer (six inch wafers were used throughout), the resulting film is characterized by a very high deposition rates of about 4,500 Angstroms per minute; relatively low hydrogen content, within the approximate range of 7-10 atomic weight percent; and a desirable, slight compressive stress of about 1E9 dynes/cm². Please note, the prior art ammonia gas chemistry typically comprises the combination SiH$_4$/NH$_3$/diluent where the diluent is a gas such as helium or argon or even nitrogen. Our gas chemistry described above replaces ammonia with nitrogen. That is, the increased dissociation and reactivity provided by the increasing-diameter gas inlet hole configuration allows us to use nitrogen as the main reactive gas for forming silicon nitride compounds, and not merely as a diluent. The result is a combination of good film quality, high deposition rate and low hydrogen content which heretofore was unattainable using parallel plate reactors.

It should be mentioned that we were able to use high frequency RF power of 13.56 mHz and high pressure throughout, which increases bombardment and film quality.

TABLE 1

Silicon Nitride Deposition, $N_f \approx 2.0$

| Parameters/Result | Value |
|---|---|
| Power, watts; power density, w/cm² | 350; 1.5 |
| Pressure, torr | 4.5 |
| Wafer temp., °C. | 300-360 |
| Gas chemistry: SiH$_4$/N$_2$ | 110 sccm/4.5 slm |
| Electrode spacing, d (mils) | 300 |
| Dep. rate A/min. | 4500 |
| Refractive index | 2.0 |
| H content, atomic percent | 7-10 |
| Stress, dynes/cm² | -1E9 compressive |
| Within wafer uniformity, % | ±5 |

2. NH and SiH Bonding Control in Silicon Nitride

Figure 6:
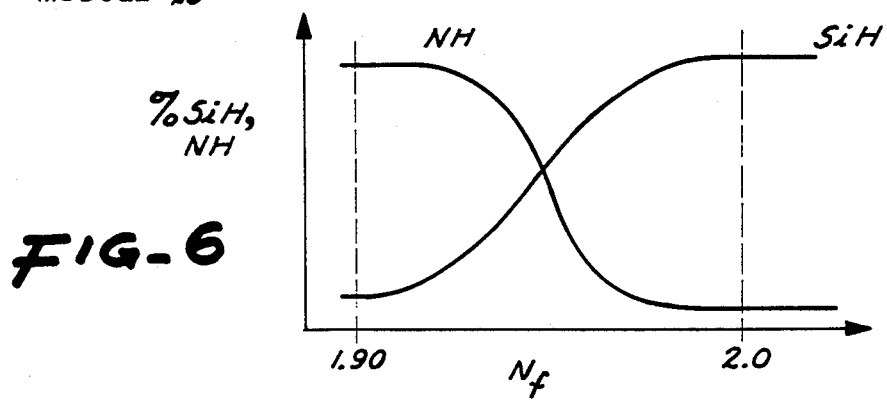
FIG. 6 is a graph of SiH and NH bonding versus refractive index.

In addition to the above advantageous characteristics, our process favors nitrogen-hydrogen bonding and affords unique control of bond distributions. As is well known in the art, the nitrogen-hydrogen bond (NH) is stronger than the silicon-hydrogen bond (SiH) and is thus generally preferable for better device characteristics, primarily increased MOS (metal oxide semiconductor) device lifetime. Referring to FIG. 6, for the conventional high temperature CVD silicon nitride deposition processes, for which $N_f \approx 2.0$ is indicative of good quality film, SiH bonding typically is dominant at the expense of NH bonding. In contrast, using our nitrogen-based gas chemistry without ammonia, the resulting silicon nitride films are characterized by $N_f = 1.9$ (which is indicative of very good quality dense film) and by the desirable, stronger NH bonding being dominant.

In addition, our process provides a number of ways of controlling the SiH and NH bonding and, specifically, of increasing NH bonding. Referring to Table 2, increasing either power or pressure increases NH bonding relative to SiH bonding silicon nitride films. Increasing the wafer temperature increases SiH bonding slightly relative to NH bonding. Regarding the gases, increasing nitrogen flow increases NH bonding slightly relative to SiH bonding whereas increasing the flow of SiH$_4$ strongly increases SiH relative to NH bonding and increasing NH$_3$ has the effect of increasing both strongly. In particular, of these parameters, increasing or varying the silane flow slightly or incorporating a small flow of a few sccm of ammonia provides a mechanism for controlling bonding and tailoring the relative amounts of NH and SiH bonding.

TABLE 2

| Parameter | Bonding Effect |
|---|---|
| >Power | SiH→NH |
| >Pressure | → |
| >Temp | ←(small) |
| >N$_2$ | →(small) |
| >SiH$_4$ | ← |
| >NH$_3$ | Both increase |

Table 3 summarizes the process parameters and the results of using power and pressure and, in particular, silane flow to provide a good quality silicon nitride film, $N_f \approx 1.9$, in which NH bonding is dominant. As indicated, the deposition rate was again quite high, about 3,200 Angstroms per minute and the film was in slight compressive stress, $-1E9$ dynes/cm².

TABLE 3

Silicon Nitride Deposition, $N_f \approx 1.9$

| Parameters/Result | Value |
|---|---|
| Power, watts; power density w/cm² | 350; 1.5 |
| Pressure, torr | 5.0 |
| Wafer temp., °C. | 300-360 |
| Gas chemistry: SiH$_4$/N$_2$ | 85 sccm/4.5 slm |
| Electrode spacing, d (mils) | 300 |
| Dep. rate A/min. | 3200 |
| Refractive index | 1.9 |
| H content, atomic percent | 7-10 |
| Stress, dynes/cm² | -lE9, compressive |
| Within wafer uniformity, % | ±5 |

3. Stress Control

The conventional way to control stress in silicon nitride films deposited using chemical vapor deposition is by adjusting frequency, power or electrode spacing. That is, increasing the frequency tends to increase tensile stress (or decrease compressive stress); increasing power has the opposite effect; and varying the electrode spacing has the same tendency as does varying the frequency, but the effect is smaller. Of these parameters, only frequency and power substantially affect stress. Unfortunately, the variations in frequency and power can strongly affect other film properties. Also, stress may be a very strong function of power with the result that it is difficult to use power to control stress.

Our process provides another, unique mechanism for stress control: the use of nitrogen. We have discovered that increasing (decreasing) nitrogen flow increases tensile stress or decreases compressive stress (or vice versa). The use of nitrogen as the dominant nitrogen source permits the use of this characteristic to control stress without affecting other film properties. This use of nitrogen as a control mechanism is reflected in the process parameters and in the stress values of the various silicon nitride and silicon oxynitride examples given here.

Additional control of the nitride/oxynitride deposition process and the resulting film is provided by adding small amounts of NF$_3$ and/or NH$_3$ additive or dopant to the gas chemistry.

NF$_3$ lowers the hydrogen content, increases the deposition rate slightly, and lowers compressive stress significantly. For example, in the above examples the addition of only one or two sccm NF$_3$ in 4.5 slm nitrogen can decrease stress from $-1E9$ compressive to zero compressive stress. This effect is summarized in Table 4.

TABLE 4

| Silicon Nitride Deposition | |
|---|---|
| Parameters/Result | Value |
| Power, watts; power density, w/cm$^2$ | 350; 1.5 |
| Pressure, torr | 5.0 |
| Wafer temp., °C. | 300–360 |
| Gas chemistry: SiH$_4$/N$_2$/NF$_3$ | 85 sccm/4–5 slm/ 1–2 sccm |
| Electrode spacing, d (mils) | 300 |
| Dep. rate A/min. | 3300–3400 |
| Refractive index | 1.86 |
| H content, atomic percent | 5–7 |
| Stress, dynes/cm$^2$ | ~0 |
| Within wafer uniformity, % | ±5 |

The addition of small amounts of NH$_3$ relative to the nitrogen used in our nitrogen-based gas chemistry process can be used to increase the deposition rate, to increase the hydrogen content to a value which is between that of the low hydrogen film and that of conventional films, to decrease the compressive stress (or alternatively increase the tensile stress) of low hydrogen content films, to improve the step coverage by increasing the hydrogen content and, as mentioned previously, to increase NH and SiH bonding. The effects of relatively small amounts of ammonia on deposition rates, stress and hydrogen content are illustrated in Table 5.

TABLE 5

| Silicon Nitride Deposition | |
|---|---|
| Parameters/Result | Value |
| Power, watts; power density, w/cm$^2$ | 350; 1.5 |
| Pressure, torr | 5.0 |
| Wafer temp., °C. | 300–360 |
| Gas chemistry: SiH$_4$/N$_2$/NH$_3$ | 85 sccm/4.5 slm/ 30 sccm |
| Electrode spacing, d (mils) | 300 |
| Dep. rate A/min. | 3600–3800 |
| Refractive index | 1.9 |
| H content, atomic percent | 15–20 |
| Stress, dynes/cm$^2$ | 5E8, compressive |
| Within wafer uniformity, % | ±5 |

4. Silicon Oxynitride Deposition

We have found that the addition of N$_2$O to our basic N$_2$/SiH$_4$ nitrogen-based gas chemistry provides silicon oxynitride films which are characterized by low hydrogen content, very well controlled within wafer composition uniformity of four to five percent, as well as high deposition rates and controlled stress. Relative to the silicon nitride deposition discussed above, the N$_2$O additive has the effect of decreasing the refractive index, increasing the deposition rate and decreasing compressive stress. Table 6 lists an exemplary set of parameters/results for depositing silicon oxynitride, again on silicon substrates and evidences these effects.

TABLE 6

| Silicon Oxynitride Deposition | |
|---|---|
| Parameters/Result | Value |
| Power, watts; power density, w/cm$^2$ | 350; 1.5 |
| Pressure, torr | 5.0 |
| Wafer temp., °C. | 300–360 |
| Gas chemistry: SiH$_4$/N$_2$/N$_2$O sccm | 85/4.5 slm/30 |
| Electrode spacing, d (mils) | 300 |

TABLE 6-continued

| Silicon Oxynitride Deposition | |
|---|---|
| Parameters/Result | Value |
| Dep. rate A/min. | 4000 |
| Refractive index | 1.75 |
| H content, atomic percent | <6 |
| Stress, dynes/cm$^2$ | -5E8, compressive |
| Within wafer uniformity, % | ±5 |

Also, in general the discussion above regarding silicon nitride deposition and the effect of various factors in controlling stress, bonding and other properties applies here as well.

For example, Table 7 indicates the effect of adding ammonia as a dopant. Consistent with the previous discussion of silicon nitride films, the ammonia increases the hydrogen content and the deposition rate. The film refractive index, $N_f \approx 1.75$, is characteristic of ultraviolet-transparent oxynitride films suitable for use in EPROM (electrically programmable read-only memory) devices.

TABLE 7

| Silicon Oxynitride Deposition | |
|---|---|
| Parameters/Result | Value |
| Power, watts; power density, w/cm$^2$ | 350; 1.5 |
| Pressure, torr | 5.0 |
| Wafer temp., °C. | 300–360 |
| Gas chemistry: SiH$_4$/N$_2$/NH$_3$/N$_2$O sccm | 80/4.5 slm/50/40 |
| Electrode spacing, d (mils) | 300 |
| Dep. rate A/min. | 5000 |
| Refractive index | 1.75 |
| H content, atomic percent | <10 |
| Stress, dynes/cm$^2$ | -5E8, compressive |
| Within wafer uniformity, % | ±5 |

5. SILICON OXIDE DEPOSITION

Using our gas inlet manifold face plate 30 containing the hexagonal close pack array of increasing-diameter holes 31 and SiH$_4$/N$_2$O gas chemistry has enabled us to deposit silicon oxide films at very high deposition rates using relatively lower power. The oxide has proven even less sensitive to patterning than the silicon nitride and silicon oxynitride films. Consequently, we have been able to use 200 mil electrode spacing to increase the deposition rate. Table 8 illustrates this process and the resulting characteristics for silicon dioxide films deposited on silicon substrates.

TABLE 8

| Silicon Oxide Deposition | |
|---|---|
| Parameters/Results | Value |
| Power, watts; power density, w/cm$^2$ | 200; 0.85 |
| Pressure, torr | 3.0 |
| Wafer temp., °C. | 300 |
| Gas chemistry: SiH$_4$/N$_2$O | 40 sccm/1 slm |
| Electrode spacing, d (mils) | 200 |
| Dep. rate A/min. | 8,000–10,000 |
| Refractive index | 1.46 |
| H content, atomic percent | 0 |
| Stress, dynes/cm$^2$ | -1E9, compressive |
| Within wafer uniformity, % | ±5 |

6. Alternatives

Having thus described a preferred and alternative configurations, those of usual skill in the art will readily derive still additional embodiments and variations which are within the scope of the above description and the following claims. For example, other vertical cross-sectional shapes which increase in transverse dimension toward the front or outlet end of the aperture, i.e., along the direction of flow from high to low pressure, can be used. These include in addition to the described conical shaped holes, hyperbolic, parabolic or bowl shaped, and semi-ellipsoidal profiles. In addition, it should be quite apparent from the above discussion that the invention applies not only to the specific reactor 11 but to CVD reactors in general and to parallel plate plasma reactors in particular which are used to deposit thin films and, still more generally, to any process which uses an inlet aperture for supplying gases across a pressure differential.

What is claimed is:

1. In an RF vacuum deposition chamber system, a gas inlet manifold which is an RF electrode and includes at least a plurality of gas inlet holes therein, each hole comprising an outlet at the processing side of the gas inlet manifold and an inlet spaced from the processing side, said outlet being larger than said inlet, for increasing the dissociation by RF energy applied to the gas inlet manifold of gas passing through the holes.

2. The RF vacuum chamber of claim 1, wherein lines connecting the opposite sides of the inlet to the corresponding sides of the outlet subtend an angle of about 15°–60°.

3. The RF vacuum changer of claim 2, wherein the hole cross-section is conical.

4. The RF vacuum chamber of claim 3, wherein the sides of the conical hole subtend an angle of about 30°.

5. The RF vacuum chamber of claim 2, wherein the hole cross-section is concave.

6. The RF vacuum chamber of claim 1, wherein the hole cross-section is conical.

7. The RF vacuum chamber of claim 6, wherein the sides of the conical hole subtend an angle of about 30°.

8. The RF vacuum chamber of claim 1, wherein the hole cross-section is concave.

9. The RF vacuum chamber of claim 1, wherein the hole cross-section is selected from parabolic and hyperbolic.

10. The RF vacuum chamber as in any of claims 1, 2, 6, 7, 8, 9 or 3-5, wherein the holes are formed in a pattern of interlocking face-centered hexagons in a face plate of the manifold in which the individual holes define an edge of one associated hexagon and are at the center of a second associated hexagon.

11. The RF vacuum chamber of claim 10, wherein the gas is nitrogen.

* * * * *

REEXAMINATION CERTIFICATE (3228th)

United States Patent [19]

Chang et al.

[11] B1 4,854,263

[45] Certificate Issued  Jun. 17, 1997

[54] INLET MANIFOLD AND METHODS FOR INCREASING GAS DISSOCIATION AND FOR PECVD OF DIELECTRIC FILMS

[75] Inventors: Mei Chang; David N. K. Wang, both of Cupertino; John M. White, Hayward; Dan Maydan, Los Altos Hills, all of Calif.

[73] Assignee: Applied Materials, Inc., Santa Clara, Calif.

Reexamination Request:
No. 90/004,123, Dec. 18, 1995

Reexamination Certificate for:
Patent No.: 4,854,263
Issued: Aug. 8, 1989
Appl. No.: 85,424
Filed: Aug. 14, 1987

[51] Int. Cl.[6] .................................................. C23C 16/00
[52] U.S. Cl. .......................... 118/715; 118/50.1; 118/725; 118/728
[58] Field of Search ...................... 118/723 VE, 723 E, 118/723 I, 50.1, 620; 427/569, 585, 562

[56] References Cited

FOREIGN PATENT DOCUMENTS 60-37118  2/1985  Japan .

*Primary Examiner*—Bernard D. Pianalto

[57] ABSTRACT

An inlet gas manifold for a vacuum deposition chamber incorporates inlet apertures which increase in diameter or cross-section transverse to the direction of gas flow. The aperture configuration increases the dissociation gases such as nitrogen and, thus increases the rate of silicon nitride deposition provided by nitrogen gas chemistry, without requiring the use of reactants such as ammonia. While one could use ammonia in the deposition gas chemistry if desired, the process provides the option of completely eliminating ammonia. The inlet manifold containing the increasing-diameter gas inlet holes provides enhanced control of the process and the deposited film, and is also useful for forming other dielectrics such as silicon oxide and silicon oxynitride. In particular, silicon oxynitride films are characterized by low hydrogen content and by compositional uniformity.

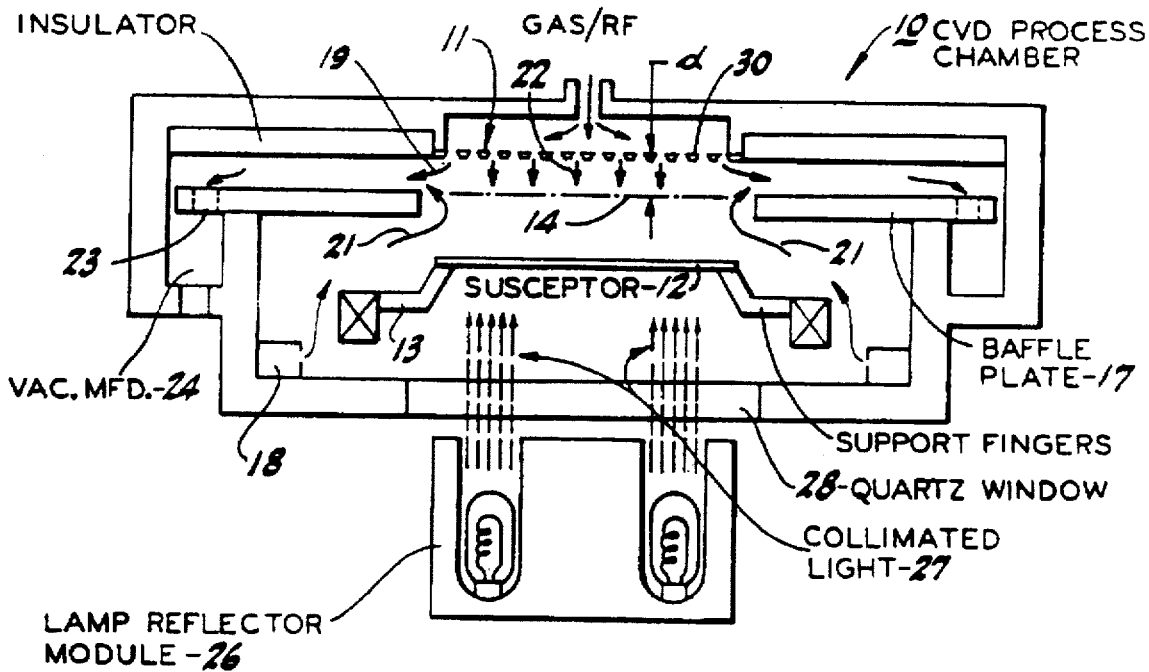

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 10 are determined to be patentable as amended.

Claims 2–9 and 11, dependent on an amended claim, are determined to be patentable.

New claims 12–22 are added and determined to be patentable.

1. In an RF vacuum deposition chamber system, a gas inlet manifold which is an RF electrode [and] *and a spaced, parallel support electrode for supporting a substrate thereon to be processed horizontally;* wherein the gas inlet manifold includes [at least] a plurality of gas inlet holes therein, each hole comprising an outlet at the processing side of the gas inlet manifold and an inlet spaced from the processing side, said outlet being larger than said inlet, for increasing [the] dissociation by RF energy applied to the gas inlet manifold of gas passing through the holes, *and wherein the spacing is close enough and the density of the holes is high enough to provide substantially uniform distribution of said dissociated gas over the supported substrate.*

10. [The] *In an* RF vacuum *deposition* chamber [as in any of claims 1, 2, 6, 7, 8, 9 or 3–5] *system, a gas inlet manifold which is an RF electrode and includes at least a plurality of gas inlet holes therein, each hole comprising an outlet at the processing side of the gas inlet manifold and an inlet spaced from the processing side, said outlet being larger than said inlet, for increasing the dissociation by RF energy applied to the gas inlet manifold of gas passing through the holes, wherein the holes are formed in a pattern of interlocking face-centered hexagons in a face plate of the manifold in which the individual holes define an edge of one associated hexagon and are at the center of a second associated hexagon.*

*12. In an RF vacuum deposition chamber system including a gas inlet manifold electrode and a spaced, parallel support electrode for the substrate to be processed in the chamber, the improvement comprising:*

*a gas inlet manifold electrode which includes at least a plurality of gas inlet holes therein, each hole comprising an outlet at the processing side of the gas inlet manifold and an inlet spaced from the processing side, said outlet being larger than said inlet, for increasing the dissociation by RF energy applied to the gas inlet manifold of gas passing through the holes.*

*13. An RF vacuum deposition chamber system as in claim 12 wherein said gas is nitrogen.*

*14. The RF vacuum chamber as in claim 10 wherein lines connecting the opposite sides of the inlet to the corresponding sides of the outlet subtend an angle of about 15°–60°.*

*15. The RF vacuum chamber as in claim 14 wherein the hole cross section is conical.*

*16. The RF vacuum chamber as in claim 15 wherein the sides of the conical hole subtend an angle of about 30°.*

*17. The RF vacuum chamber as in claim 14 wherein the hole cross section is concave.*

*18. The RF vacuum chamber as in claim 10 wherein the hole cross section is conical.*

*19. The RF vacuum chamber as in claim 18 wherein the sides of the conical hole subtend an angle of about 30°.*

*20. The RF vacuum chamber as in claim 10 wherein the hole cross section is concave.*

*21. The RF vacuum chamber as in claim 10 wherein the hole cross section is selected from parabolic and hyperbolic.*

*22. An RF vacuum deposition chamber system according to claim 1 wherein a distance between said inlet and said outlet, and the relative sizes of said inlet and said outlet, are determined for preventing arcing behind said inlet.*

\* \* \* \* \*